United States Patent [19]
Chen et al.

[11] Patent Number: 6,024,799
[45] Date of Patent: Feb. 15, 2000

[54] CHEMICAL VAPOR DEPOSITION MANIFOLD

[75] Inventors: Chen-An Chen, Sunnyvale; Karl Anthony Littau, Palo Alto, both of Calif.

[73] Assignee: Applied Materials, Inc., Santa Clara, Calif.

[21] Appl. No.: 08/890,805

[22] Filed: Jul. 11, 1997

[51] Int. Cl.$^7$ .................................................. C23C 16/00
[52] U.S. Cl. ............................................................ 118/715
[58] Field of Search ............................................. 118/715

[56] References Cited

U.S. PATENT DOCUMENTS

| | | | |
|---|---|---|---|
| 4,854,263 | 8/1989 | Chang et al. | 118/715 |
| 5,472,565 | 12/1995 | Mundt et al. | 216/71 |
| 5,500,249 | 3/1996 | Telford et al. | 427/255 |
| 5,595,606 | 1/1997 | Fujikawa | 118/725 |
| 5,714,031 | 2/1998 | Mundt et al. | 156/345 |
| 5,728,223 | 3/1998 | Murakami et al. | 118/715 |

FOREIGN PATENT DOCUMENTS

| | | |
|---|---|---|
| 0 283 007 A2 | 9/1988 | European Pat. Off. . |
| 0 637 055 A1 | 2/1995 | European Pat. Off. . |
| 0 738 788 A2 | 10/1996 | European Pat. Off. . |
| 62-177180 | 8/1987 | Japan . |
| 94/17353 | 8/1994 | WIPO . |

*Primary Examiner*—Bruce Breneman
*Assistant Examiner*—Erin Fieler
*Attorney, Agent, or Firm*—Thomason, Moser & Patterson

[57] ABSTRACT

A manifold for use in a chemical vapor deposition reactor, optimized for providing effective deposition on a substrate of a specific diameter. The manifold has upstream and downstream faces and is of substantially circular shape, with a central region of the downstream face being perforated by a plurality of upstream-directed bores. The central region is substantially larger than a circle of the specific wafer diameter for which the reactor is optimized. A centrally located plurality of the bores are through-bores or holes to the upstream face of the manifold that define a gas flow path from an upstream gas source to the wafer.

27 Claims, 5 Drawing Sheets

CHEMICAL VAPOR DEPOSITION MANIFOLD

BACKGROUND

This invention relates to the field of chemical vapor deposition (CVD), and more particularly to CVD reactors of the type featuring a gas inlet manifold or face plate in close facing relationship to a substrate upon which deposition is desired.

Figure 1:
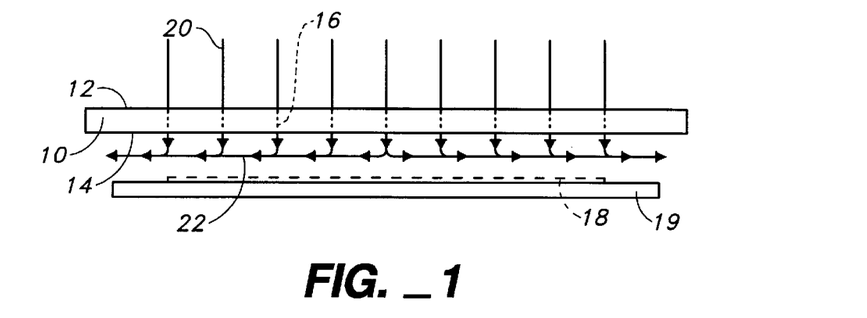
FIG. 1 is a partial schematic view of a chemical vapor deposition reactor showing a flow of gas to a wafer being processed.
Figure 2:
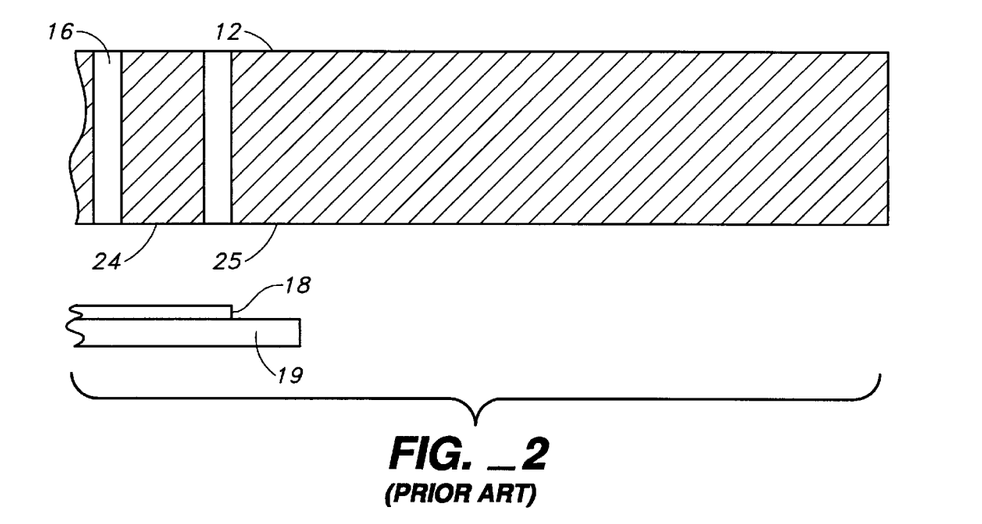
FIG. 2 is a partial schematic cross-sectional view of a prior art face plate.

CVD, in its many forms, is a process which may used to apply a thin layer or film of material to a substrate, typically a semiconductor wafer, by introduction of reactant gasses in the presence of applied heat. The wafer is typically held on a flat susceptor or other heater element. Common deposited materials include silicon nitride, silicon oxide, silicon oxynitride and/or tungsten silicide. Some reactors utilize a plasma of the reactant gasses in a plasma enhanced CVD process (PECVD). Common means of forming the plasma used in PECVD reactors are radio frequency (RF) excitation. In common constructions, both PECVD and basic CVD reactors feature a flat plate distribution manifold or "face plate" in an operative position in close facing relationship to the face of the substrate onto which the film is to be deposited. As is shown in a most schematic form in FIG. 1, the manifold 10 typically has flat upstream and downstream faces 12 and 14 with a central array of holes 16 extending therebetween and covering an area corresponding to the plan area of the substrate 18. Reactant gas 20 flows through the holes to the substrate. In RF reactors, the manifold serves as an RF electrode. In some CVD reactors, one manifold configuration involves a hole array wherein the holes are formed as narrow straight bores arranged along the circumferences of circles of incrementally greater radius starting in the center of the face plate and spanning a region from the center to the a radial location approximately the same as the radius of the substrate. In such a configuration, the majority of the surface area of the upstream and downstream faces of the manifold is left intact and unaffected by the holes (FIG. 2).

In one particular design for a manifold used in an RF reactor, shown in U.S. Pat. No. 4,854,263, issued Aug. 8, 1989, the disclosure of which is incorporated herein by reference, the straight bores are replaced with holes having an outlet diameter greater than their inlet diameter so as to increase the dissociation and reactivity of reactant gas passing through the manifold. To maximize hole density, the holes are arranged in an hexagonal closed packed array.

During the CVD process, deposition occurs not simply upon the target face of the wafer but, especially, on any hot surface such as a heater 19 or a susceptor. The growth of such unwanted deposit layers can cause any of a number of problems. To keep unwanted deposits under control, a reactive plasma cleaning may be performed, often at predetermined intervals during a process run, such as after every $n^{th}$ wafer is processed. Typical cleaning processes include the introduction of a cleaning gas and the application of heat. As with deposition, the heat may come from a number of sources. Typical cleaning gases are compounds of fluorine such as chlorine trifluoride ($ClF_3$), or perfluorocompounds such as nitrogen trifluoride ($NF_3$).

Although an inherent purpose of cleaning is to maintain the performance of the reactor, a correlation has been observed between reactor cleaning and degradation in the consistency and the uniformity of deposition. In particular, it is believed that periodic cleaning of the reactor with a gas such as $ClF_3$ may result in the formation of aluminum fluoride (AF) deposits on the manifold. Specifically, the gas flows through the manifold along the same path as reactant gas 20 of FIG. 1, and then comes into contact with the hot heater 19 (there typically being no wafer 18 in the reactor during cleaning). With the heater formed of a substance such as aluminum nitride (AlN), fluorine radicals are believed to react with the heater to produce $AlF_3$, which joins the radial outward flow 22 of gas in the space between the heater and manifold. The flow 22 shown in FIG. 1 is highly generalized and schematic. An actual flow may involve a variety of flow structures which can provide gas transport to and between the surfaces of the heater (when the wafer is removed) and face plate.

Because the manifold is kept at a relatively lower temperature than the heater, the $AlF_3$ molecules are believed to preferentially deposit on the manifold. These deposits are believed to increase the emissivity of the manifold and, thereby, to reduce the temperature of the wafers in subsequent processing. This has led to observed reductions in film thickness and resistivity in wafers processed after cleaning. Additionally, the altered emissivity is believed to be associated with a lack of deposition uniformity across the surface of each individual wafer processed in the reactor. In particular, a reduced resistivity has been observed near the wafer perimeter relative to resistivity near the wafer center.

It is believed that deposits on the portion 24 of the manifold immediately opposite the wafer, i.e. in the central circular region of the manifold of the same radius as the wafer, have significant effect on the wafer and process. However, deposits on the portion 25 of the manifold immediately radially beyond this region also have significant effect, especially upon peripheral portions of the wafer. In particular, deposits on the portion of the manifold immediately beyond the perimeter of the wafer may be involved in the lack of uniformity of deposition on a given wafer. The peripheral portion of the wafer is still in sufficient proximity to the portion 25 of the manifold immediately laterally beyond the wafer so that an emissivity increase along this portion 25 of the manifold will decrease wafer temperature near the wafer periphery.

Accordingly, it is desirable to alleviate or reduce the separate and combined effects of deposits in both the central and peripheral regions of the manifold.

SUMMARY OF THE INVENTION

In general, in one aspect, the invention is directed to a manifold for use in a chemical vapor deposition reactor, optimized for providing effective deposition on a substrate of a specific diameter. The manifold has upstream and downstream faces and is of substantially circular shape, with a central region of the downstream face being perforated by a plurality of upstream-directed bores. The region is substantially larger than a circle of the specific wafer diameter for which the reactor is optimized. A centrally located plurality of the bores are through-bores or holes to the upstream face of the manifold that define a gas flow path from an upstream gas source to the wafer downstream.

Implementations of the invention may include one or more of the following features. A remaining plurality of the bores may have no through-flow of gas and may reduce the surface area of the downstream face of the manifold so as to reduce changes in the manifold's emissivity caused by operation of the reactor. This remaining plurality of bores may be blind bores terminating without reaching the upstream face of the manifold. The centrally located plurality of bores, or all the bores, may be substantially hexagonally close packed and may have cross-sectional areas at their outlets larger than cross-sectional areas at a region between their inlets and outlets.

In another aspect, the invention is directed to a manifold having a central plurality of holes which bound an upstream to downstream gas flow path. Each hole has an inlet at the upstream face of the manifold and an outlet at the downstream face of the manifold. Substantially each hole has an intermediate region between its inlet and outlet, which intermediate region has a smaller cross-sectional area than the cross-sectional areas at the inlet and outlet.

Implementations of the invention may include one or more of the following features. The intermediate region of each hole may be of uniform circular section. Each hole may have a downstream region of uniform circular section at the outlet. Each hole may have an upstream region of uniform circular section at the inlet. Each hole may have a conical transition region between the downstream region and the intermediate region and/or a conical transition region between the upstream region and the intermediate region. The cross-sectional area of each hole at the inlet may be smaller than the cross-sectional area at the outlet. The holes may be arranged in a hexagonal packed array, and may be arrayed over an array radius of between about 105% and 120% of the radius of the wafer, or, more particularly of approximately 115%.

In yet another aspect, the invention relates to a manifold having at least a central plurality of channels extending between upstream and downstream faces and bounding a gas flow path through the channels. Each channel is of non-uniform co-axial circular section. A first region of each channel immediately adjacent the downstream face is of uniform section and joins an upstream second region of smaller diameter than that of the first region.

Implementations of the invention may include one or more of the following. The second region may be of conical form and may join an upstream third region of uniform section having a diameter less than the diameter of the first region. The central plurality of channels may be in a hexagonal packed array extending over a central circular region of the manifold. The second region may be of uniform section and may extend to the upstream face. The second region may join an upstream third region of conical form of greater diameter than the diameter of the second region.

In yet another aspect, the invention relates to a manifold formed as a unitary metal plate having upstream and downstream faces and a generally flat central section. The manifold has at least a central plurality of channels which bound an upstream to downstream gas flow path, each such channel having an inlet at the upstream face of the manifold and an outlet at the downstream face of the manifold. A plurality of blind bores extend upstream from the downstream face of the manifold and terminate prior to reaching the upstream face of the manifold.

Implementations of the invention may include one or more of the following. The central plurality of channels may be arrayed in a central circular portion of the manifold and the plurality of bores may be spread over a peripheral portion of the manifold radially beyond the central circular portion.

In yet another aspect, the invention relates to a manifold having upstream and downstream faces with at least a central plurality of channels extending therebetween and bounding a gas flow path through the channels. The manifold has means for reducing aluminum fluoride deposits on the downstream face of the manifold, which reducing means are located at least in part at a radial distance from a central axis of the manifold greater than a radius of a substrate on which a film will be deposited.

An advantage of the invention is the reduction or alleviation of the effects of deposits on the downstream face of the manifold. This is achieved by removing material from the downstream manifold face so as to reduce the proportion of the downstream face left intact. The invention enhances deposition uniformity between sequential wafers processed in a CVD reactor and enhances deposition uniformity across the surface area of individual wafers being processed. Embodiments of the invention may be specifically useful as retrofits for existing CVD reactors or may be integrated within the original reactor design.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference numbers and designations in the various drawings indicate like elements.

DETAILED DESCRIPTION

Figure 3:
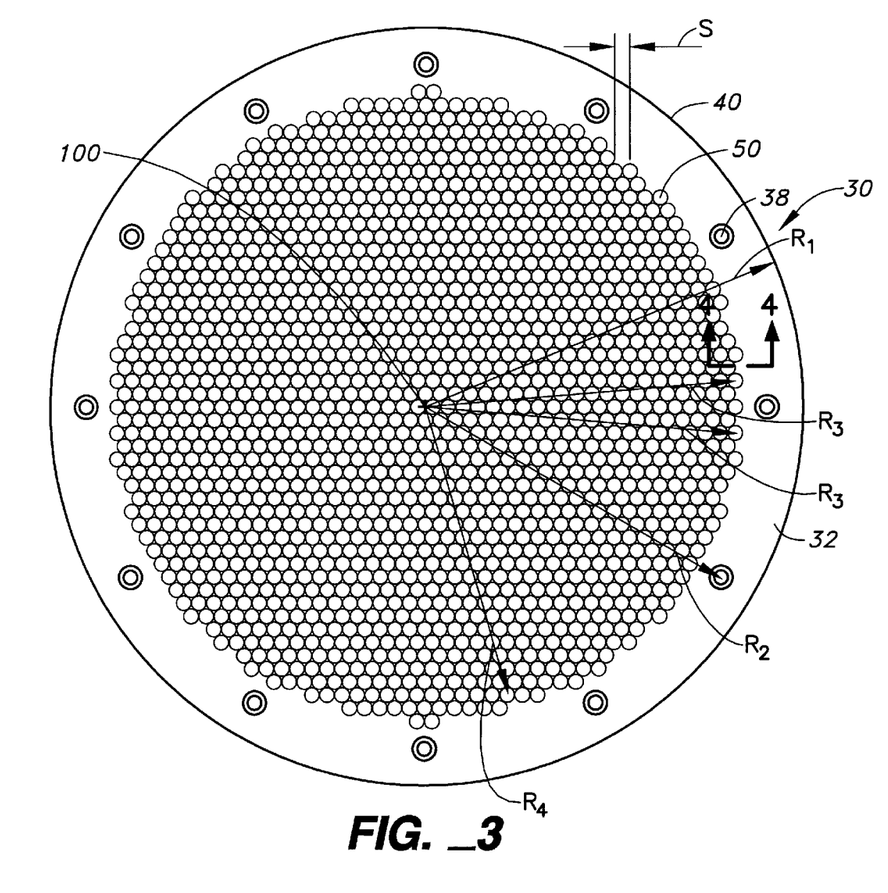
FIG. 3 is a front view of a manifold according to the present invention.
Figure 4:
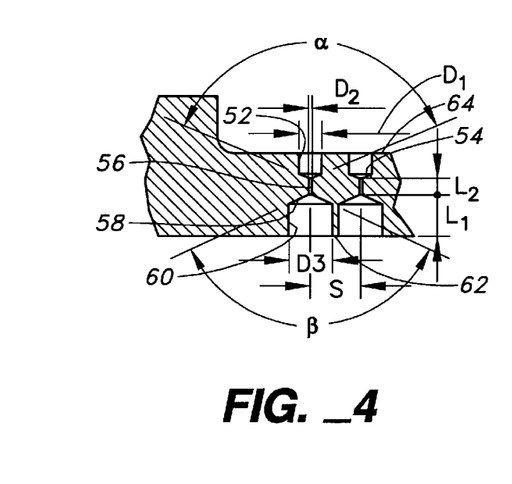
FIG. 4 is a partial cross-sectional view of a channel in the manifold of FIG. 3, taken along line 4—4.
Figure 5:
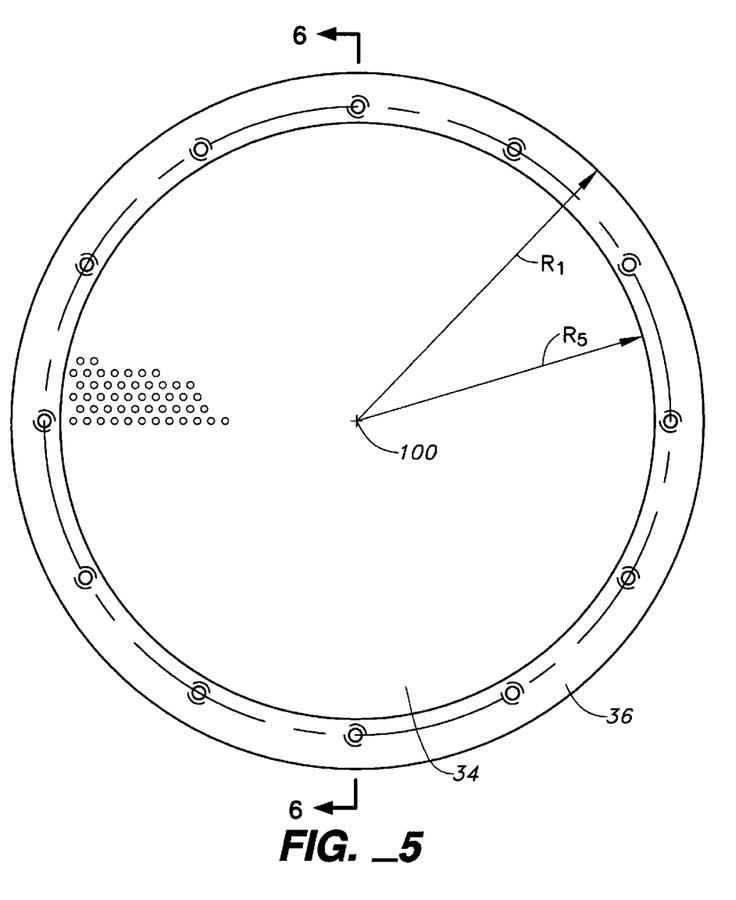
FIG. 5 is a back view of the manifold of FIG. 3.
Figure 6:
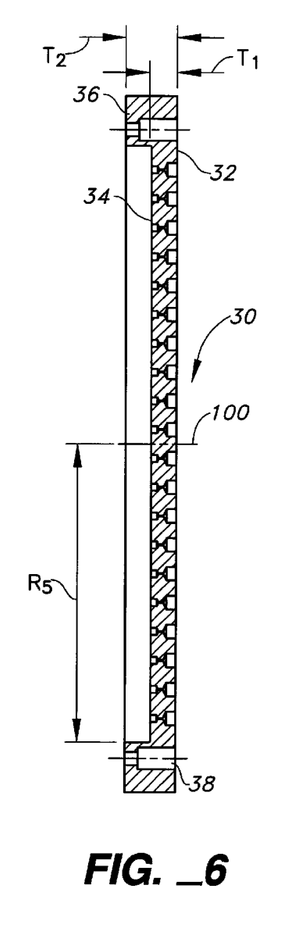
FIG. 6 is a cross-sectional view of the manifold of FIG. 5, taken along line 6—6.

As shown in FIGS. 3–6, a manifold 30 according to the present invention has a substantially circular shape with a cylindrical perimeter 40 at a radius $R_1$ from a central axis 100. The manifold has a planar downstream face 32 and a substantially planar upstream face 34 having a longitudinal structural lip 36 at its perimeter (FIG. 6). Adjacent the perimeter, a plurality of counterbored mounting holes 38, at a radius $R_2$ from the central longitudinal axis 100 of the manifold, extend from the downstream face 32 to the upstream face 34. An array of holes or through-bores 50 extend between the upstream and downstream faces, each having an inlet at the upstream face and an outlet at the downstream face. The through-bores are in a hexagonally close packed array of packing separation S (the distance between the centers of adjacent bores). The array is centered about the longitudinal axis 100 of the manifold and extends so that the centers of the farthest through-bores 50 are at a radius $R_3$ from the central axis. Of all the through-bores at the periphery of the array, the closest to the axis 100 has a center at a radius $R_4$ from the axis. The lip 36 begins at a radius $R_5$ from the central axis 100, slightly beyond the perimeter of the array of through-bores 50 (FIG. 5).

As shown in FIG. 4, from upstream to downstream, each through-bore 50 has an upstream region 52 of uniform circular section at the inlet, connecting to a first conical transition region 54 which in turn connects to an intermediate region 56 of uniform circular section. The intermediate region 56, in turn, connects to a second conical transition region 58 which finally connects to a downstream region 60, at the outlet, of uniform circular section.

In an exemplary construction, the upstream region has a diameter $D_1$ equal to about 0.110 inches, the intermediate region has a diameter $D_2$ equal to about 0.016 inches and the downstream region has a diameter $D_3$ equal to about 0.213 inches. The cone angles $\alpha$ and $\beta$ of the first and second conical transition regions, respectively, are both about 120°. In an exemplary embodiment, configured for use with one particular type of reactor, but more importantly, configured for use with a 200 millimeter diameter wafer, the thickness $T_1$ (FIG. 6) of the manifold between upstream and downstream faces is about 0.400 inches along the central region of the manifold, and the thickness $T_2$ along the lip 36 is equal to about 0.800 inches. The intermediate region has a length $L_2$ and the combined downstream region and second transition region have a length $L_1$. The length $L_1$ is about 0.20 inches and the length $L_2$ is about 0.08 inches. The radius $R_1$ is about 5.450 inches, the radius $R_2$ is about 4.925 inches, the radius $R_3$ is about 4.532 inches, the radius $R_4$ is about 4.322 inches, and the radius $R_5$ is about 4.675 inches. In the exemplary embodiment, the array may contain 1,574 through-bores 50.

The selection of $D_2$ and the packing separation S, which in the exemplary construction can be approximately 0.218 inches, is made largely to achieve desired gas flow characteristics and their selection may be a matter of optimization in the ordinary course of manifold design. With these dimensions substantially determined, the diameter $D_3$ is chosen to be as large as possible without leaving too fragile a web 62 of material between the downstream cylindrical sections 60 of adjacent bores. It is desirable that $D_1$ be larger than $D_2$ so as to present less restriction to gas flow through the channel. However, $D_2$ would preferably be somewhat less than $D_3$ (leaving a thicker web 64 between the upstream cylindrical sections 52) so as to provide a modicum of strength and rigidity to the plate.

Figure 7:
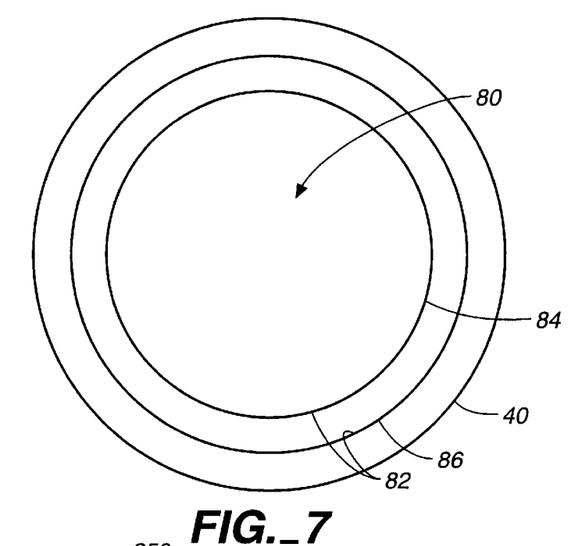
FIG. 7 is a schematic plan view of a manifold according to the present invention.

Thus as is shown schematically in FIG. 7, the array covers an area of the manifold including: a) a central circular area 80 having a perimeter 84 of the same radius as the wafer; and b) a generally annular perimeter region 82 between the central area's perimeter 84 and the array's perimeter 86, shown in FIG. 3.

Precise characterization of the size of the array of through-bores is difficult. For example, assuming that a characteristic radius is sought, is such radius the distance (from the central axis) of the farthest hole in the array or of the closest perimeter hole, which may be at a somewhat lesser radius? Also, once the particular hole is chosen, is the characteristic radius to the center of the hole or to its perimeter? As can be seen from the discussion below, the relative differences among choosing any of these formulas for a particular array are small. The respective radii (as measured from axis 100) of the farthest and closest through bores at the periphery of the array are $R_3$=4.532 inches and $R_4$=4.322 inches. It can thus be seen that the array is substantially larger than the 200 millimeter wafer for which the manifold is optimized. Although nominally described as "8 inch" wafers, 200 millimeter wafers are more accurately 7.87 inches in diameter or 3.937 inches in radius. If, rather than the by radii $R_3$ or $R_4$, the size of the array were described relative to the perimeter of the downstream section 60 of the through-bores at radii $R_3$ and $R_4$ respectively, then 0.1065 (half of $D_3$) is added to $R_3$ and $R_4$ to determine the perimeter of the array as measured by the material removed from the downstream surface 32 of the manifold. This yields measurements of 4.64 inches ($R_3$+½$D_3$) and 4.43 inches ($R_4$+½$D_3$), respectively. Thus, by any reasonable measurement the radius of the array is substantially larger than the wafer radius. By way of example, the radius (and thus diameter) at the perimeter 86 may preferably be at least about 105% of the radius (or diameter) at perimeter 84. A preferable range would be between approximately 110% and 120%, with the latter being constrained largely by the total size of the manifold and the effort required to make the holes.

Figure 8:
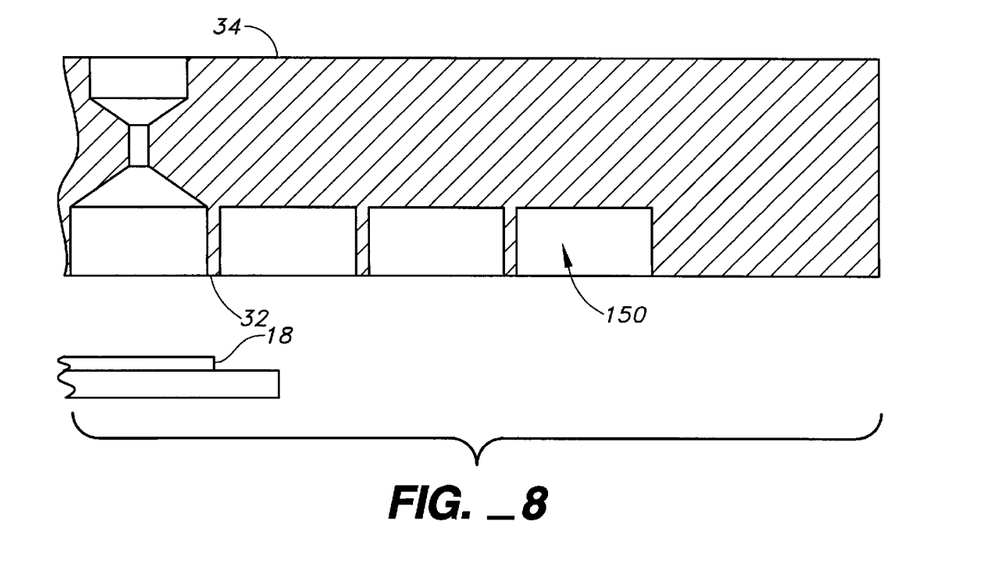
FIG. 8 is a partial cross-sectional view of a manifold with blind bores according to the present invention.

As shown in FIG. 8, in one embodiment the bores in the peripheral annular portion 82 of the array, at a radial location beyond the radius of the wafer, are formed as blind bores 150 extending upstream from the downstream face 32 of the manifold but terminating before reaching the upstream face 34 of the manifold. There is no through flow of gas within a blind bore. Rather, the blind bores serve to reduce the intact surface of the downstream face 32 of the manifold. As such, this reduces changes in the manifold's emissivity otherwise caused by aluminum fluoride deposits which would deposit on the downstream face in the peripheral portion 82, thereby affecting the temperature of the wafer during deposition (especially near the periphery of the wafer). The blind bores may be formed in the same hexagonal close packed array as are the through-bores in the central region 80 of the face plate.

The use of blind bores or, more generally, bores through which there is no through-flow of gas, has a number of potential applications. As is shown in FIG. 8, in the peripheral annular portion 82 of the manifold, through-bores may not be particularly relevant during the deposition process but become relevant during the cleaning process as described above. There may be situations where either: a) it is impractical to have gas flow through the annular portion 82, such as with a manifold made as a retrofit for an existing reactor which simply does not have an appropriate interface to allow gas flow over an area larger than the area of the wafer; or b) the gas flow would be possible but may not be desired, such as simply for economizing the use of reactant gas or for more complex process-related purposes. In the former situations, it may be irrelevant whether the bores in annular portion 82 are through-bores or blind bores, for example in situations where if they were through-bores they would be blocked. In certain retrofit situations it may be desirable to have the blind bores extending in an array substantially all the way to the manifold perimeter 40. For example, if the overall diameter of the faceplate is such that there is significant effect on wafer temperature from deposits very close to the manifold perimeter, the bores (blind or through) may be extended substantially all the way to the manifold perimeter.

Theoretically, with no through-flow of gas, the interior of a blind bore may be subject to some level of aluminum fluoride deposits. The effect of such deposits is believed to be reduced (relative to deposits on the flat surface of the downstream face) because the blind bore will tend to behave somewhat as a black hole, especially if it is relatively narrow and deep, thus causing less of an emissivity increase and less of a temperature reduction at the wafer.

Figure 9:
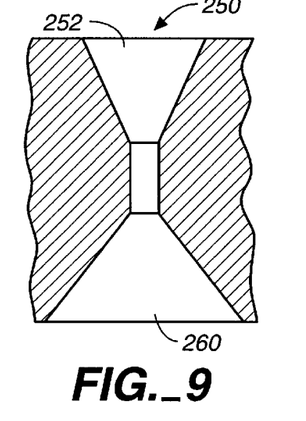
FIGS. 9, 10, 11, and 12 are partial cross-sectional views of further embodiments of a manifold according to the present invention.

In a further embodiment shown in FIG. 9, relative to the through-bore 50 of FIG. 4, the upstream region and its associated transition region and/or the downstream region and its associated transition region may be combined such as in a bore 250. Bore 250 has conical upstream and downstream regions 252 and 260, respectively.

Figure 10:
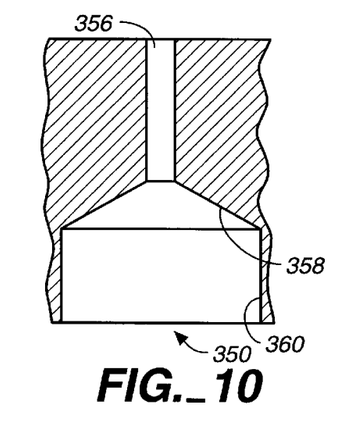

In another embodiment shown in FIG. 10, the upstream region and intermediate region of bore 350 are joined as a single region 356 of uniform circular section. The downstream region 360 and its associated conical region 358 may be otherwise the same as regions 60 and 58 of the embodiment of FIG. 4.

Figure 11:
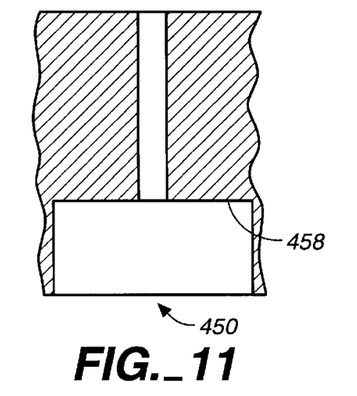
Figure 12:
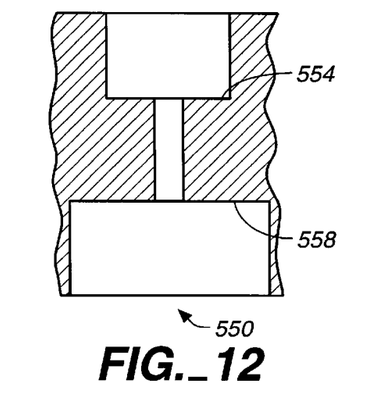

In yet another embodiment shown in FIG. 11, relative to the bore 350 of the embodiment in FIG. 10, the conical transition region 358 has been replaced in bore 450 with a planar transition region 458. In another embodiment in FIG. 12, both conical transition regions have been replaced by planar transition regions 554 and 558 in bore 550. Such a planar region may replace a conical transition region of the bore 50 of FIG. 4 if desired.

Figure 13:
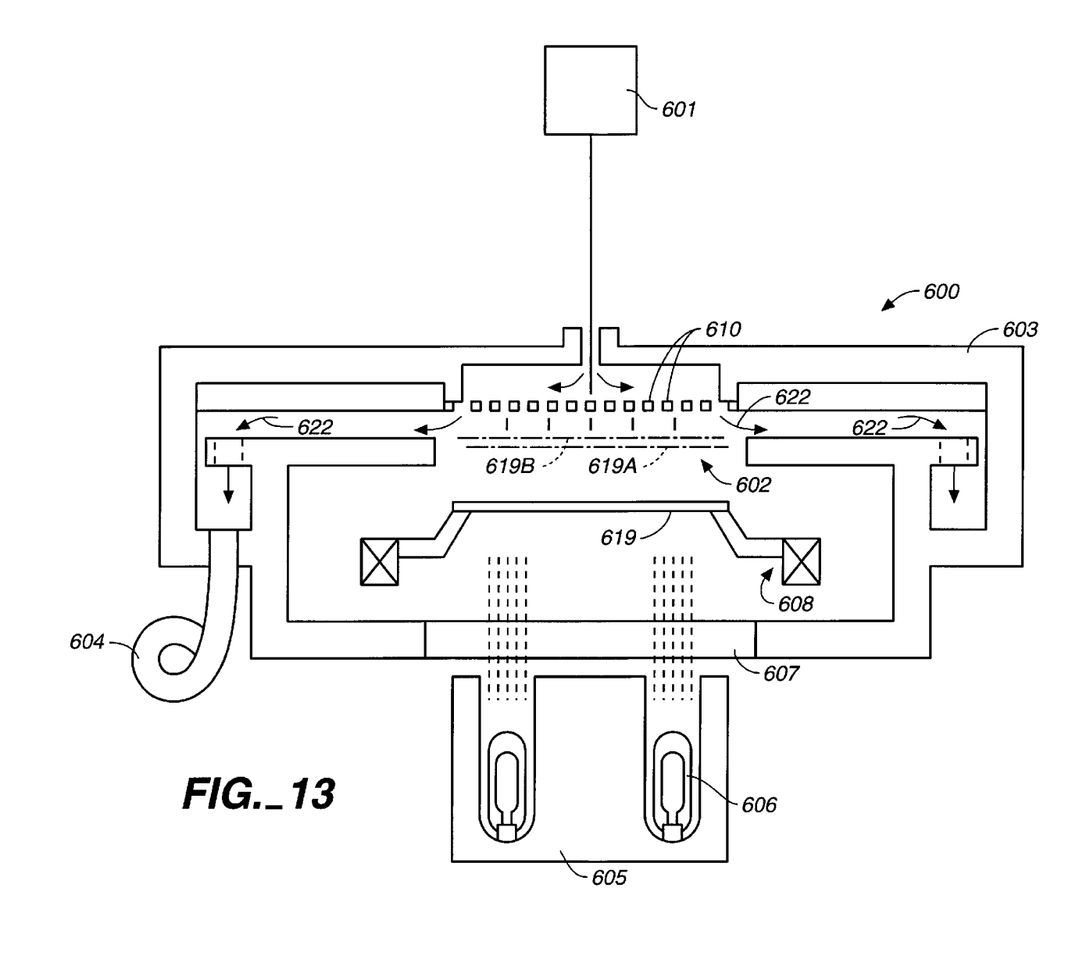
FIG. 13 is a partial semi-schematic view of a chemical vapor deposition reactor.

As shown in FIG. 13, a manifold 610, according to the invention, may be used in a CVD reactor 600 of any appropriate type. The reactor includes a gas source/delivery system 601 for delivering reactant gas and/or cleaning gas to the reactor chamber 602. The chamber has a body 603 which is additionally connected to a vacuum pump 604 for evacuating the chamber. A lamp module 605, having lamps 606 may provide light through a glass window 607 in the chamber base to heat the susceptor 619, which is shown in a lowered wafer loading/unloading position. The susceptor is held by raisable and lowerable supports 608 to allow it to be raised to a cleaning position 619A and processing position 619B. An exemplary gas flow path 622 is shown for introducing gas into the chamber through the manifold, however alternate paths with additional branches are possible.

Summarizing the problem, the use of cleaning gases containing fluorine has been observed to be associated with degradation in the consistency and uniformity of deposition on substrates in CVD reactors. During cleaning, the flow of the cleaning gas is generally longitudinally through the holes whereupon it is diverted radially outward between the downstream face of the face plate and the heater, the flow from the radially inboard holes joining that from more radially outboard holes as the flow proceeds by the latter. The combined flow includes not simply the cleaning gas but also byproducts such as deposited material removed from the heater and the aluminum fluoride in question. As this contaminated flow flows alongside the downstream face of the manifold, wherever there is intact surface (the areas between the holes and the area radially outboard of the perimeter of the array of holes), the aluminum fluoride may be deposited, raising the emissivity of the manifold wherever such deposits occur. When subsequent processes are run, the increased emissivity of those areas will tend to lower the temperature of those portions of the wafer within immediate sight of the areas (relative to a faceplate without deposits).

In a variety of embodiments and by a variety of methods, the invention reduces and minimizes the opportunity for the formation of aluminum fluoride deposits and ameliorates their effect. This is achieved by removing material from the downstream face of the manifold in a central region aligned with a wafer in the reactor and/or in a region radially therebeyond. In the central region, process considerations determine the desired flow of gas through the manifold and the flow of gas through the manifold is largely controlled by the number of holes and their minimal cross-sectional areas. Thus, by maximizing the size of each hole's outlet at the downstream face of the manifold and providing the hole with an intermediate region between the inlet and outlet, which intermediate region has a cross-sectional area smaller then the outlet, a desired gas flow can be achieved while reducing the effect of deposits on the downstream face of the manifold. The invention may thus be used to both increase the uniformity of deposition within individual wafers and to increase consistency of deposition on subsequent batches of wafers processed in the reactor. The manifold of the present invention may be provided as a retrofit to an existing reactor or incorporated into the design of a new reactor.

A number of embodiments of the present invention have been described. Nevertheless, it will be understood that various modifications may be made without departing from the spirit and scope of the invention. For example, it is easily understood that certain structural features of the manifold will be influenced or determined by the interface presented in the reactor where the manifold is to be used. Specific dimensions may be varied depending on the specific intended application and the scale of the reactor being used. Accordingly, other embodiments are within the scope of the following claims.

What is claimed is:

1. An inlet manifold for use in a chemical vapor deposition process, comprising:
   a plate defining at least a central plurality of holes which bound an upstream to downstream gas flow path, wherein one or more of the holes have an inlet at an upstream face of the manifold, an outlet at a downstream face of the manifold and an intermediate region between the inlet and the outlet of the hole, which intermediate region has a cross-sectional area smaller than cross-sectional areas of the inlet and outlet and the inlet has a cross-sectional area smaller than the cross-sectional area of the outlet.

2. The inlet manifold of claim 1 wherein the intermediate region is of uniform circular section.

3. The inlet manifold of claim 1 wherein the one or more holes have a downstream region of uniform circular section at the outlet.

4. The inlet manifold of claim 1 wherein the one or more holes have an upstream region of uniform circular section at the inlet.

5. The inlet manifold of claim 1 wherein the one or more holes have:
   a downstream region of uniform circular section at the outlet;
   a first conical transition region between the downstream region and the intermediate region;
   an upstream region of uniform circular section at the inlet; and
   a second conical transition region between the upstream region and the intermediate region.

6. The inlet manifold of claim 1 wherein the one or more holes have:
   a downstream region of uniform circular section at the outlet;
   a first conical transition region connecting the downstream region and the intermediate region;
   an upstream region of uniform circular section at the inlet; and a second conical transition region connecting the upstream region and the intermediate region.

7. The inlet manifold of claim 1 wherein the central plurality of holes are in a hexagonal packed array.

8. An inlet manifold for use in a chemical vapor deposition reactor, comprising;

upstream and downstream faces with at least a central plurality of channels extending therebetween and bounding a gas flow path through the channels, one or more of the channels having a non-uniform co-axial circular section, wherein a first region of the channels immediately adjacent the downstream face is of uniform section and joins an upstream second region immediately adjacent the upstream face having a smaller diameter than the diameter of the first region and having an intermediate region between the first and second regions smaller than the first and second regions.

9. The manifold of claim 8 wherein the second region is at least partially of conical form.

10. The manifold of claim 9 wherein the central plurality of channels are in a hexagonal array extending over a central region of the manifold.

11. The manifold of claim 8 wherein the second region is at least partially of uniform section.

12. The manifold of claim 8 wherein the intermediate region is at least partially of uniform section.

13. An inlet manifold for use in a chemical vapor deposition process, comprising:

a unitary metal plate having upstream and downstream faces and a generally flat central section, and having:
at least a central plurality of channels which bound an upstream to downstream gas flow path, one or more of the channels having an inlet at the upstream face of the manifold and an outlet at the downstream face of the manifold; and
a plurality of blind bores extending from the downstream face of the manifold and terminating prior to reaching the upstream face of the manifold.

14. The inlet manifold of claim 13 wherein the central plurality of channels are arrayed in a central portion of the manifold and wherein the plurality of blind bores are spread over a peripheral portion of the manifold radially beyond the central portion.

15. A manifold for use in chemical vapor deposition, configured for providing deposition on a wafer, comprising:

upstream and downstream faces of substantially circular shape, a region of the downstream face being perforated by a plurality of upstream-directed bores, and wherein the perforated region is substantially larger than a projected perimeter of a wafer to be processed.

16. The manifold of claim 15 wherein a centrally located plurality of the bores are trough-bores to the upstream face of the manifold, the through-bores defining a gas flow path from an upstream gas source to a downstream wafer, and wherein a remaining plurality of the bores have no through-flow of gas.

17. The manifold of claim 16 wherein substantially all of the remaining plurality of bores are blind bores terminating without reaching the upstream face of the manifold.

18. The manifold of claim 15 wherein one or more of the bores of the perforated region are through-bores extending from the upstream to the downstream faces of the manifold and wherein a remaining plurality of bores are substantially close packed in a region peripheral to the perforated region.

19. The manifold of claim 15 wherein the region perforated by the plurality of upstream-directed bores has a diameter at least 105% of the projected wafer perimeter.

20. The manifold of claim 19 wherein the region perforated by the plurality of upstream-directed bores has a diameter of 110–120% of the projected wafer perimeter.

21. An inlet manifold for use in a chemical vapor deposition reactor, comprising:

upstream and downstream faces with at least a central plurality of channels extending therebetween and bounding a gas flow path through the channels; and
means for reducing aluminum fluoride deposits on the downstream face of the manifold, wherein the reducing means are located at least in part at a radial distance from a central axis of the manifold greater than a radius of a substrate on which a film will be deposited by the reactor.

22. A chemical vapor deposition reactor, comprising:

a reactor chamber;
a gas delivery system coupled to the chamber;
a substrate holder disposed in the chamber;
a heater coupled to the substrate holder; and
a face plate, comprising: an upper face and a lower face, the lower face in substantially parallel facing relation to an upper face of the substrate holder, a region of the lower face being perforated by a plurality of upward-directed bores, and wherein the perforated region is larger than a projected perimeter of a wafer to be processed.

23. The reactor of claim 22 wherein one or more of the bores are of non-uniform co-axial circular section, wherein a first region of the bores immediately adjacent the lower face is of uniform section and joins an upper second region of smaller diameter than the diameter of the first region.

24. The reactor of claim 22 wherein one or more of the bores have an inlet at the upper face of the face plate, an outlet at the lower face of the face plate, where the inlet has a smaller cross-sectional area than an outlet cross-sectional area and an intermediate region between the inlet and outlet of the bore, which intermediate region has a cross-sectional area smaller than cross-sectional areas of the inlet and outlet.

25. The reactor of claim 24 wherein one or more of the bores have:

a lower region of uniform circular section at the outlet;
a first conical transition region between the lower region and the intermediate region;
an upper region of uniform circular section at the inlet; and
a second conical transition region between the upper region and the intermediate region.

26. The inlet manifold of claim 7, wherein the hexagonal packed array extends over a central region of the manifold and wherein a remaining plurality of holes are spread over a peripheral portion of the manifold.

27. The manifold of claim 15, wherein the perforated region fully overlaps the projected perimeter of a wafer to be processed.

* * * * *